(12) United States Patent
Pacheco Rotondaro et al.

(10) Patent No.: US 8,049,254 B2
(45) Date of Patent: Nov. 1, 2011

(54) SEMICONDUCTOR DEVICE WITH GATE-UNDERCUTTING RECESSED REGION

(75) Inventors: Antonio Luis Pacheco Rotondaro, Dallas, TX (US); Trace Q. Hurd, Plano, TX (US); Elisabeth Marley Koontz, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 12/408,992

(22) Filed: Mar. 23, 2009

(65) Prior Publication Data

US 2009/0174005 A1    Jul. 9, 2009

Related U.S. Application Data

(62) Division of application No. 11/379,408, filed on Apr. 20, 2006, now Pat. No. 7,528,072.

(51) Int. Cl.
*H01L 29/76* (2006.01)

(52) U.S. Cl. ........ 257/288; 257/204; 257/346; 257/387; 257/E29.039

(58) Field of Classification Search ............ 257/204, 257/288, 346, 387, E29.039
See application file for complete search history.

(56) References Cited

U.S. PATENT DOCUMENTS

| | | |
|---|---|---|
| 6,946,350 B2 | 9/2005 | Lindert et al. |
| 7,153,753 B2 | 12/2006 | Forbes |
| 2005/0045969 A1 | 3/2005 | Lee et al. |
| 2005/0148147 A1 | 7/2005 | Keating et al. |
| 2007/0004123 A1 | 1/2007 | Bohr et al. |
| 2007/0111417 A1 * | 5/2007 | Bryant et al. .......... 438/197 |

* cited by examiner

*Primary Examiner* — Asok Sarkar
(74) *Attorney, Agent, or Firm* — Jacqueline J. Garner; Wade J. Brady, III; Frederick J. Telecky, Jr.

(57) ABSTRACT

A semiconductor device comprises a gate structure on a semiconductor substrate and a recessed region in the semiconductor substrate. The recessed region has a widest lateral opening that is near a top surface of the semiconductor substrate. The widest lateral opening undercuts the gate structure.

8 Claims, 5 Drawing Sheets

SEMICONDUCTOR DEVICE WITH GATE-UNDERCUTTING RECESSED REGION

CROSS-REFERENCE TO RELATED APPLICATIONS

This is a division of U.S. application Ser. No. 11/379,408, filed Apr. 20, 2006, the entirety of which is incorporated herein by reference.

TECHNICAL FIELD

The invention is directed, in general, to semiconductor devices and integrated circuit devices; and, more specifically, to such devices formed with recesses.

BACKGROUND

The continuing push to produce faster semiconductor devices with lower power consumption has resulted in device miniaturization. In particular, smaller channel lengths are conducive to the low voltage and faster operation of semiconductor devices, such as complementary metal oxide (CMOS) transistors. With shrinking process geometries, the use of new materials is being explored to further reduce power consumption and increase switching speeds.

Currently, there is interest in improving carrier mobility by inducing stress in the channel region of semiconductor substrates. In some cases, a portion of the substrate is removed and replaced with a material that can serve as source or drain structures and, also provide a tensile or compressive stress to the channel region. Unfortunately, some of these devices can have an undesirably high leakage current, and in some cases, a high diode leakage. Additionally, the process used to remove portions of the substrate can introduce non-uniformities into the substrate surface, making it more difficult to form contacts to the device. Furthermore, such devices, when comprising nickel silicide source or drain electrodes, are prone to forming pipe-shaped defects that can short-out the device or otherwise cause a device malfunction.

Accordingly, what is needed is a semiconductor device and its method of manufacture that imparts strain into the channel region of the device while not suffering the drawbacks of prior art devices.

SUMMARY

One embodiment is a semiconductor device. The device comprises a gate structure on a semiconductor substrate and a recessed region in the semiconductor substrate. The recessed region has a widest lateral opening that is near a top surface of the semiconductor substrate. The widest lateral opening undercuts the gate structure.

Another embodiment is a semiconductor device configured as an integrated circuit that comprises a transistor device comprising the above-described gate structure and recessed region, insulating layers formed over the transistor device, and interconnections that contact the transistor device.

DESCRIPTION OF EXAMPLE EMBODIMENTS

The present invention recognizes, for the first time, that forming recessed regions (e.g., openings) of a particular shape is important to optimizing carrier mobility while avoiding the aforementioned current leakage problems. In particular, it is desirable to form recessed regions having a widest lateral opening that is near a top surface of the semiconductor substrate. This provides maximal compressive or tensile stress to a region of the substrate that can be controlled by the gate, e.g., a channel region, thereby minimizing the leakage current. This is in contrast to some recessed region shapes (e.g., recess-regions with rounded lateral edges) whose widest lateral opening occurs deep in the substrate and remote from the gate.

While not limiting the scope of the invention by theory, it is believed that current leakage in such structures occurs in the vicinity of this deep location, where two such recessed regions on either side of the channel are closest to each other. It is not practical to control current leakage at this location by applying a potential to the gate because the location is remote from the gate. Additionally, the present invention benefits from the discovery that certain types of crystallographic orientation dependent wet etches facilitate the formation of the recessed regions having the desired shape. The use of such wet etches can reduce, or eliminate altogether, the need to use a dry etch to form the recessed region. This is an advantage because many dry etch processes used for source and drain recess formation also undesirably remove portions of shallow trench isolation (STI) structures (e.g., silicon dioxide filled STI structures). This can create non-uniformities in the substrate surface and create regions susceptible to diode leakage and metal silicide pipe formation.

Figure 1:
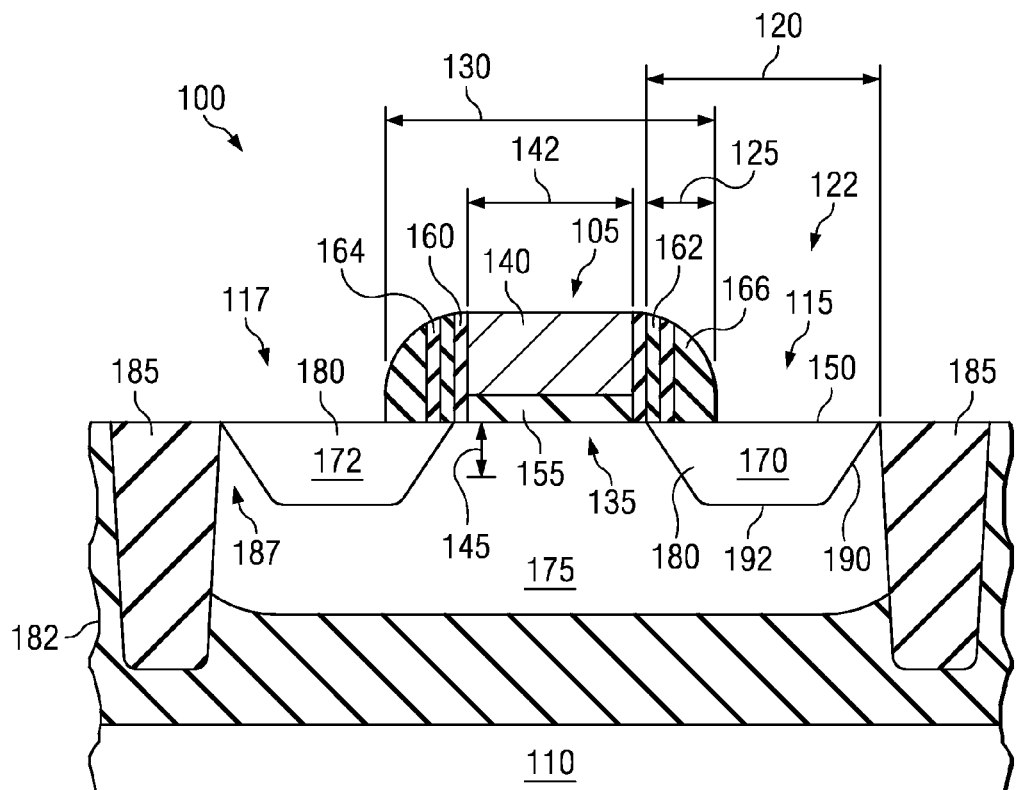
FIG. 1 illustrates a cross-sectional view of a semiconductor device to which an example implementation of the invention can be applied.

One embodiment is a semiconductor device. FIG. 1 shows a cross-sectional view of an example semiconductor device 100. The semiconductor device 100 comprises a gate structure 105 on a semiconductor substrate 110 and a recessed region 115, and in some cases, a second recessed region 117, in the semiconductor substrate 110. The recessed region 115 has a widest lateral opening 120 that is near a top surface 122 of the semiconductor substrate 110. Also, the widest lateral opening 120 undercuts the gate structure 105.

As shown in FIG. 1, the widest lateral opening 120 undercuts the gate structure 105 when a portion 125 of the recess region 115 is underneath a perimeter 130 of the gate structure 105. The widest lateral opening 120 is near the top surface 122 when the widest lateral opening 120 is located in a region of the substrate 110, e.g., a channel region 135, that is controllable by applying an electrical potential to a gate electrode 140. For instance, for gate lengths 142 of about 100 nm or less, the gate 140 can control current flow through the channel region 135 to a depth 145 in the substrate 110 of about 25 nm. In such instances the widest lateral opening 120 is preferably within about 10 nanometers of the top surface 122. One skilled in the art would understand how the depth 145 of substrate 110 controllable by the gate electrode 140 would be different for different gate lengths 142 and therefore how locating the widest lateral opening 120 near the top surface 122 would vary accordingly.

In some preferred embodiments, as shown in FIG. 1, there are two recessed regions 115, 117 located on either side of the channel region 135. In such cases, it is desirable that the widest lateral opening 120 would correspond to those portions of recessed regions 115, 117 that are in closest proximity to each other. In some preferred embodiments, the two recessed regions 115, 117 have shapes that are mirror images of each other because such structures are easier to manufacture and have more predictable compressive effects on the channel region 135.

As shown in FIG. 1, a cross section of the recessed region 115 can have a substantially trapezoidal shape whose longest parallel side 150 corresponds to the widest lateral opening 120. In this example, the trapezoidal shape of one recessed region 115 is a mirror image of the other recessed region 117.

Figure 2A:
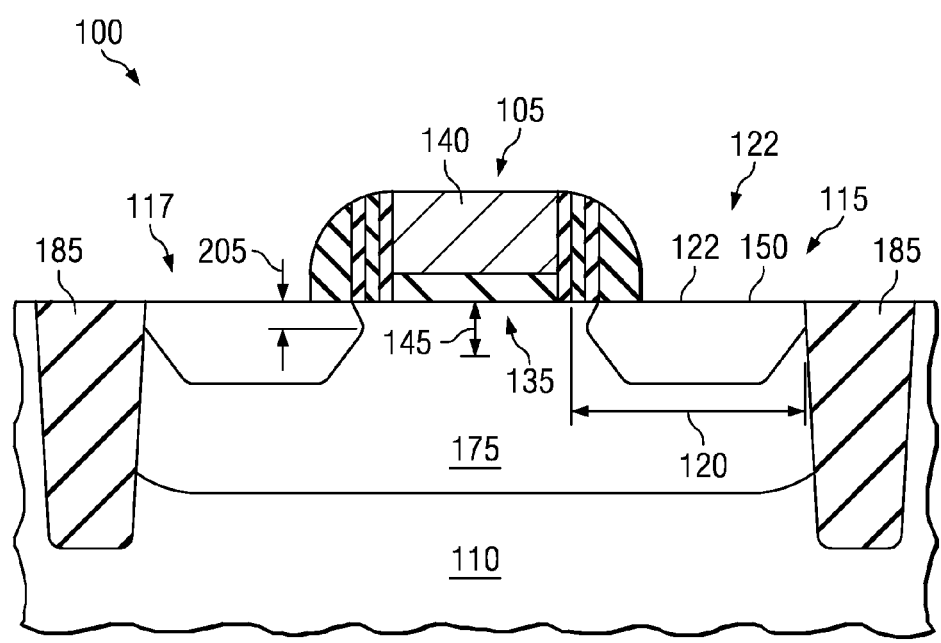
FIGS. 2A and 2B illustrates cross-sectional views of example shapes of the recessed region for a semiconductor device of the invention.
Figure 2B:
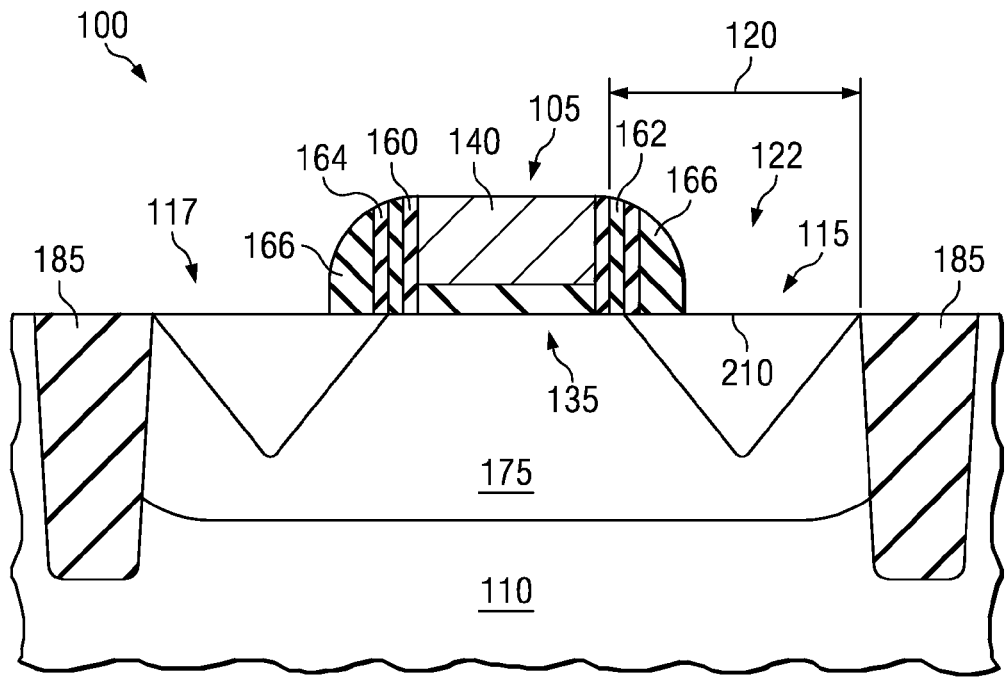

FIGS. 2A and 2B illustrates cross-sectional views of alternative shapes of the recessed region 115 or recessed regions 115, 117 that could be incorporated into embodiments of the device 100. For clarity, several components, analogous to that shown in FIG. 1, are not labeled. FIG. 2A shows a recessed region 115 that defines a substantially trapezoidal shape in the cross-sectional view. Although the widest lateral opening 120 is not coincident with the longest parallel side 150 at the substrate surface 122, the widest lateral opening 120 is still near enough the surface 122 to be controlled by the gate 140. For example, the widest lateral opening 120 is preferably located at a depth 205 from the surface 122 that is less than or equal to the depth 145 in the substrate 110 to which the gate 140 can control current flow in the channel region 135.

In other embodiments, as shown in FIG. 2B, a cross section of the recessed region 115, or regions 115, 117 can define a substantially triangular shape. In this case, a side 210 of the triangularly-shaped recess region 115 that is nearest the surface 122 corresponds to the widest lateral opening 120.

As shown in FIG. 1, some preferred embodiments of the gate structure 105 include a gate insulation layer 155 and one or more gate spacers 160, 162, 164, 166. For the example device 100 in FIG. 1, the gate structure 105 comprises a silicon oxide gate insulating layer 155, a first silicon oxide gate spacer 160, a silicon nitride gate spacer 162, a second silicon oxide gate spacer 164 and a second silicon nitride gate spacer 166. The gate spacers 160, 162, 164, 166 advantageously localize the dopants of the source and drain regions and source and drain extensions. In some cases, the widest lateral opening 120 of the recessed regions 115, 117 undercuts one or more of the spacers 160, 162, 164, 166. Undercutting one or more of the spacers 160, 162, 164, 166 is desirable because it positions the recessed region 115 closer to the channel region 135, thereby allowing greater stress to be applied to the channel region 135.

In other cases, the widest lateral opening 120 also undercuts the gate electrode 140 of the gate structure 105. Undercutting the gate electrode 140, however, may not be desirable in cases where the material in the recessed region 115 can interact with the gate electrode 140 or the gate insulator 155. For instance, such interactions can detrimentally affect device performance by increasing gate-to-drain leakage.

In some preferred embodiments, the recessed regions 115, 117 comprise one of a source 170 or a drain structure 172 for the semiconductor device 100. For the example device 100 illustrated in FIG. 1, the source and drain structures 170, 172 are located in a doped region 175 of the substrate 110.

It is desirable for the recessed region 115 (or regions 115, 117) to comprise a material 180 that causes compressive or tensile stress on the channel region 135 located under the gate structure 105. E.g., the recessed region 115 can be filled with a compressive stress-producing material 180 such as silicon-germanium. Preferred ratios of Si:Ge range from about 10% to 30%. The recessed region 115 can be filled with a tensile-producing material such as silicon-carbon. Preferred ratios of Si:C range from about 1% to 4%.

As shown in FIG. 1, the recessed region 115 can be located in a layer 182 of the semiconductor substrate 110. For instance, the recessed region 115 can be located in a silicon layer 182 that is epitaxially grown on a silicon-germanium substrate 110, thereby making the silicon layer 182 a tensile-strained layer. In other cases, however, the recessed region 115 can be located in a silicon substrate 110. The recessed region 115 can also be located in an indium phosphide (InP) or gallium arsenide (GaAs) substrate 110, or other substrates or layers, preferably having known crystallographic orientation dependent etches.

In some preferred embodiments, the recessed region 115 is separated from an isolation region 185 (e.g., shallow trench isolation structure). That is, a portion 187 of substrate 110 remains between the isolation region 185 and the recessed region 115. Keeping the recessed region 115 separate from the isolation region 185 beneficially reduces diode leakage and pipe formation after silicidation of the source and drain structures 170, 172 because there is no direct contact between the material of the isolation region 185 (e.g., SiO2) and material of the recessed region 115 (e.g., Si:Ge).

In some cases as shown in FIG. 1, a lateral side 190 of the recessed region 115 nearest to the isolation region 185 is angled away from the isolation region 185. Consequently, a shortest parallel side 192 the recessed region 115 is farther away from the isolation region 185 than the longest parallel side 150. This beneficially eliminates defects that might form between the epitaxial layer and the isolation region 185. Such defects can detrimentally facilitate pipe defect formation during nickel silicidation of the source and drain 170, 172.

FIGS. 3 to 6 illustrate cross section views of selected steps in an example implementation of a method of fabricating a semiconductor device 100 of the invention. The same reference numbers are used to depict analogous structures to that depicted in FIG. 1.

Figure 3:
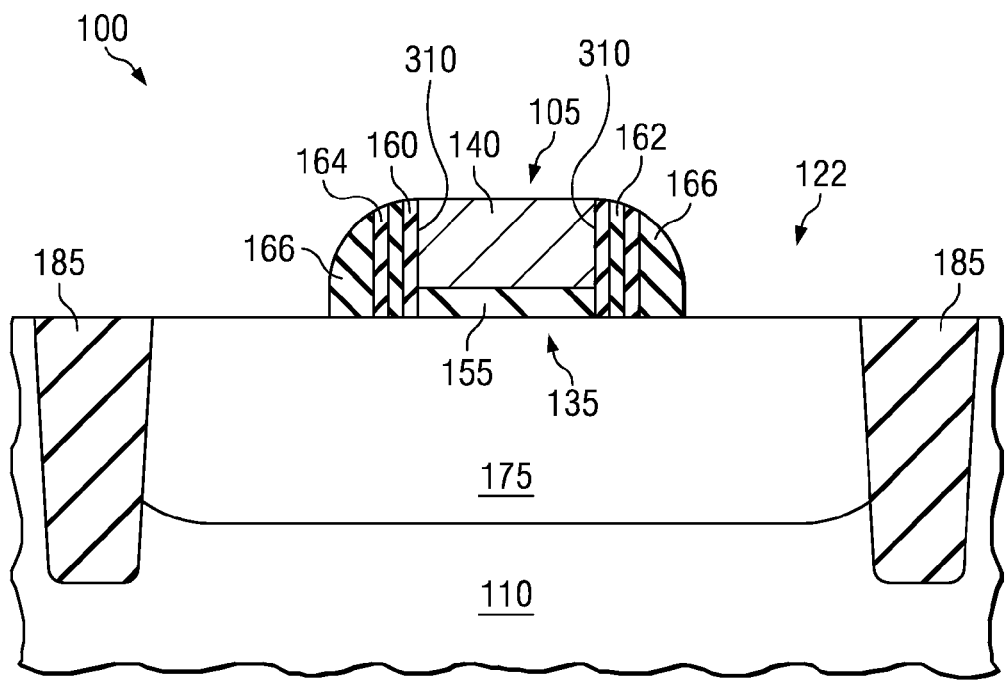
FIGS. 3 to 6 illustrate cross section views of selected steps in an example implementation of a method of fabricating a semiconductor device of the invention.

FIG. 3 shows the partially completed semiconductor device 100 after forming a gate structure 105 over a semiconductor substrate 110. Conventional materials and methods can be used to form the gate structure 105. For instance, photolithographic techniques can be used to pattern silicon oxide and polysilicon layers to form a gate insulator 155 and gate electrode 140, respectively. Gate spacers 160, 162, 164, 166 can be formed by e.g., thermally growing or chemically vapor depositing layers of silicon oxide or silicon nitride, followed by an anisotropic etch, such as a reactive ion etch (RIE) to remove portions of these layers that are not proximate to the vertical walls 310 of the gate electrode 140 (e.g., portions outside of the perimeter 130 of the gate structure 105 shown in FIG. 1).

The partially completed semiconductor device 100 in FIG. 3 is also shown after forming a doped region 175 and isolation structures 185 in the substrate 110. The doped region can be formed by implanting p-type (e.g., boron) or n-type dopants (e.g., phosphorus or arsenic) into the substrate 110 using an ion-beam implantation tool. The isolation structures 185 can be formed using conventional photolithographic patterning and etching methods to form openings in the substrate 110, followed by filling the openings with an insulating material, such as silicon oxide using physical vapor deposition (PVD) or chemical vapor deposition (CVD) processes.

Figure 4:
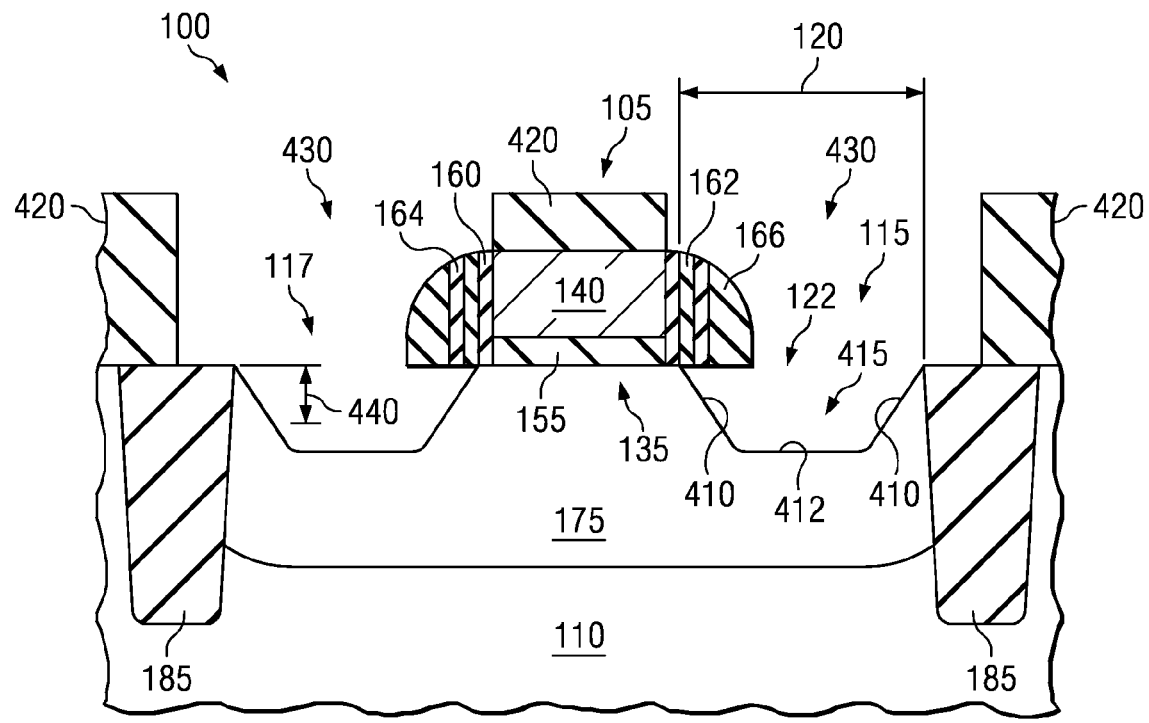

FIG. 4 presents the partially completed semiconductor device 100 after forming a recessed region 115 (or regions 115, 117) in the semiconductor substrate 110. As noted above in the context of FIG. 1, the recessed region 115 has a widest lateral opening 120 that is near a top surface 122 of the semiconductor substrate 110 and the widest lateral opening 120 undercuts a gate structure 105 of the device 100.

Forming the recessed region 115 comprises wet etching to selectively remove substrate 110 up to a predefined orientation plane 410. As illustrated in FIG. 4 the predefined orientation plane 410 can comprise one or more surfaces of the recessed region 115. Consider when the predefined orientation plane 410 comprises an [111] orientation plane in a silicon substrate 110. In some preferred embodiments, wet etching the silicon substrate 110 selectively up to the [111] orientation plane 410 comprises removing a removal plane 412 of the substrate 110. Removing an [100] orientation removal plane 412 can comprise exposing the silicon substrate 110 to an aqueous solution comprising a hydroxide salt such as potassium hydroxide. Removing an [110] orientation removal plane 412 can comprise exposing the silicon substrate 110 to an aqueous solution comprising an hydroxide salt (e.g., potassium hydroxide) and alcohol (e.g., propanol, such as n-propanol or catechol ethanol). Other possible orientation dependent etching solutions can comprise choline, tetramethyl ammonium hydroxide, tetraethylammonium hydroxide, ethylenadiamine, hydrazine or combinations thereof. In some preferred embodiments, the aqueous solution comprises about 2.4% tetramethyl ammonium hydroxide.

It is desirable for the components of the wet etch to be selected so as to not substantially remove material from other device components such as the gate structure 105 or isolation structures 185. Preferably, for example, the wet etch removes the desired removal planes 412 of silicon at least about 100 times faster than the silicon oxide or silicon nitride components of the gate structure 105 or isolation structures 185.

In some cases, as illustrated in FIG. 4, to help prevent the etching and undesired removal of device components (e.g., the gate 105 and isolation 185 structure), the substrate 110 can be coated with a hardmask 420 comprising e.g. silicon oxide using conventional techniques such as CVD. To gain access to regions of the substrate 110 selected for wet etching, openings 430 in the hardmask 420 can be made using conventional methods, such as a plasma etch, an aqueous hydrofluoric acid etch, or both.

The selective removal of the substrate 110 up to the predefined orientation plane 410 is possible because the wet etch removes portions of the substrate 110 from one orientation plane, e.g., the removal plane 412, faster than the predefined orientation plane 410. In some preferred embodiments, the wet etch removes the semiconductor substrate 110 at a rate that is at least 10 times faster from the removal plane 412 than from the predefined orientation plane 410.

For instance, embodiments of the wet etch comprising KOH:n-propanol:H2O 25:20:80 (weight percent ratios) at 80° C. can remove silicon from an [100] orientation removal plane 412 at about 1 micron per minute, which is about 100 times faster than the removal rate of silicon from an [111] predefined orientation plane 410 under the same conditions. Another embodiment of the wet etch comprises ethylenediamine:pyrocatechol:H2O 26 ml:12 ml:45 gm at about 100° C., which have a similar silicon etch rate of about 1 micron per minute in the [100] plane and similar selectivity with respect to the predefined [111] orientation plane 410.

Embodiments of the wet etch comprising KOH:H2O 50:50 (volume percent ratios) at about 80° C. can remove silicon from an [110] orientation removal plane 412 at about 1 micron per minute. This rate is about 600 times faster than the removal rate of silicon from a predefined [111] orientation plane 410 under the same conditions.

In some instances, the wet etch that is selective towards one of the removal planes 412 is continued until a predefined orientation plane 410 is reached. This can produce a triangular-shaped recessed region 115 such as depicted in FIG. 2B. In other instances, the wet etch can be performed for a shorter period, resulting in the production of a trapezoidal-shaped recessed region, such as depicted in FIG. 1.

Some embodiments of forming the recessed region 115 further include dry etching the semiconductor substrate 110. The dry etch can be an isotropic or aniostropic plasma etch and can be performed before or after the wet etch. In some embodiments, however, it is preferable for the wet etch to be performed last, because the dry etch can leave contaminants, e.g., organic or inorganic polymers associated with inductively coupled plasma dry etch processes, in the recessed region 115.

While not limiting the scope of the invention by theory, it is believed that the contaminants are deposited on surfaces 415 of the recessed region 115 that are created by dry etch plasma processes. The presence of contaminant on roughened surfaces 415, in turn, necessitates the expense of time and resources on aggressive cleaning processes (e.g., one or more of oxygen and fluorine cleaning plasmas, hydrogen bakes, wet cleans with hydrogen peroxide and ammonium hydroxide, and aqueous hydrofluoric acid cleans) before the recessed region 115 can be filled.

In contrast, the wet etch of the present invention renders surfaces 415 of the recessed region 115 substantially smoother than obtained from dry etching. E.g., in some embodiments atomically flat surfaces 415 are achieved that are significantly smoother (e.g., at least about 10 percent less) than the typical average root-mean-square variation (RMS) obtainable for the surfaces 415 when using a dry etch (e.g., about 1.5 nm RMS). Having a smoother surface 415 has two benefits. First, there are reduced amounts of contaminants deposited in the recessed region 115. This reduces the amount of time and resources spent to remove contaminants. Second, it is easier to fill the recessed region 115 by epitaxially growing a material on smooth surface 415.

The mild use, or absence, of a dry etch to form the recessed region 115 helps to keep the recessed region 115 separate from the isolation region 185 because the wet etch used to form the recessed region does not etch the isolation region 185. The mild use or absence of dry etching also helps to keep the isolation region 185 in substantially the same plane as the substrate surface 125, thereby facilitating the formation of electrical contacts to the source and drain structures 170, 172.

In some embodiments, the dry etch comprises removing an about 1 nanometer to 20 nanometer depth 440 of the substrate 110 using an anisotropic etch such as reactive ion etching comprising, e.g., HBr or similar etching chemistries. Preferably, the depth 440 removed by the dry etch is not greater than the depth 145 of substrate 110 controllable by the gate electrode 140. The dry etch is then followed by the wet etch to yield a substantially trapezoidal-shaped recessed region 115, having smooth surfaces 415 such as depicted in FIG. 2A.

Alternatively, the wet etch can be performed first, and then followed by an isotropic dry etch. The isotropic dry etch can also comprise HBr or similar etching chemistries, but used at a lower bias power setting. The isotropic dry etch tends to produce trapezoidal-shaped or substantially trapezoidal-shaped recessed region 115, such as depicted in FIGS. 1 and 2A, respectively. One skilled in the art would be familiar with other anisotropic or isotropic dry etch procedures that could be used to remove silicon or other substrate 110 in a similar fashion.

Figure 5:
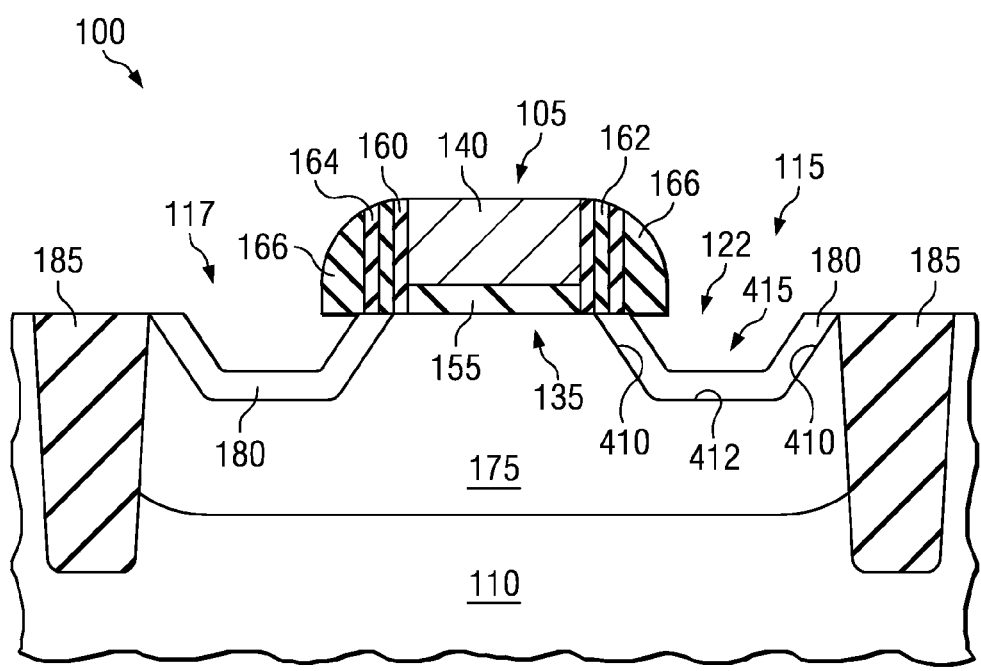

FIG. 5 shows the partially completed semiconductor device 100 while filling the recessed region 115 (or regions 115, 117) with a material 180 that causes compressive (e.g., silicon germanium) or tensile stress (e.g., silicon carbon) on the channel region 135 located under the gate structure 105. The device 100 is shown after also removing the hardmask 420, e.g., using an aqueous hydrofluoric acid etch. Preferably, the material 180 is epitaxially grown in the recessed region 115 using CVD. In some preferred embodiments, a material 180 comprising SiGe is selectively epitaxially grown in the recessed region 115 (e.g., grown on the silicon surfaces 415 of recessed region 115 to the exclusion of silicon oxide or silicon nitride covered surfaces) using a CVD process comprising SiH4:GeH4:HCL.

Figure 6:
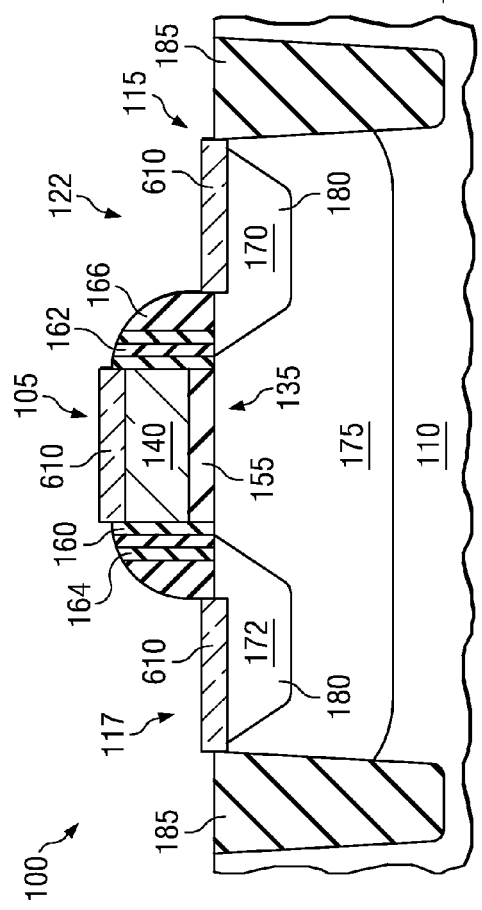

FIG. 6 shows the semiconductor device 100 after completely filling the recessed regions 115, 117 to form source and drain structures 170, 172, and after forming metal silicide electrodes 610 over the gate electrode 140, and the source and drain structures 170, 172. The metal silicide electrodes 610 can be formed by conventional methods such as, physical vapor depositing a transitional metal (e.g., nickel) over the gate electrode 140, and the source and drain structures 170, 172 and then reacting the transitional metal with the polysilicon of the gate electrode 140, and a silicon-containing material 180 (e.g., SiGe or SiC) deposited in the recessed regions 115, 117, by, e.g., heating to about 350° C.

Figure 7:
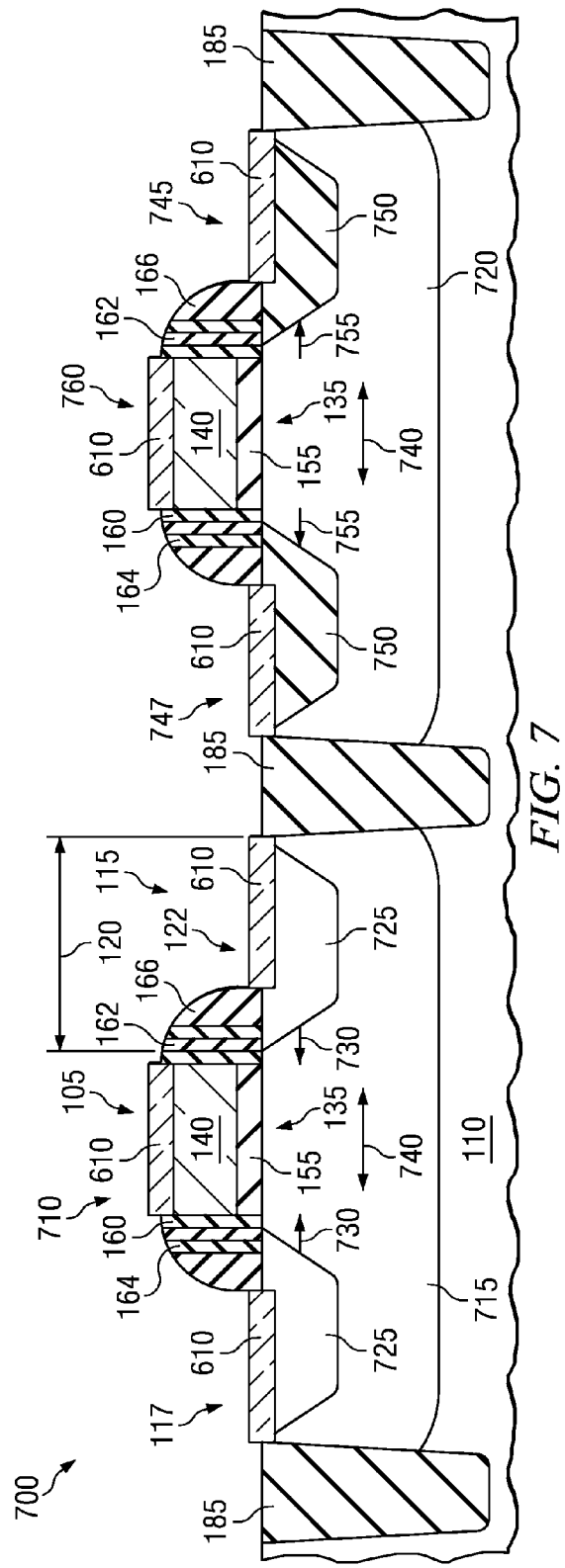
FIGS. 7 and 8 present cross-sectional views of an example method of manufacturing a semiconductor device configured as an integrated circuit according to the invention.
Figure 8:
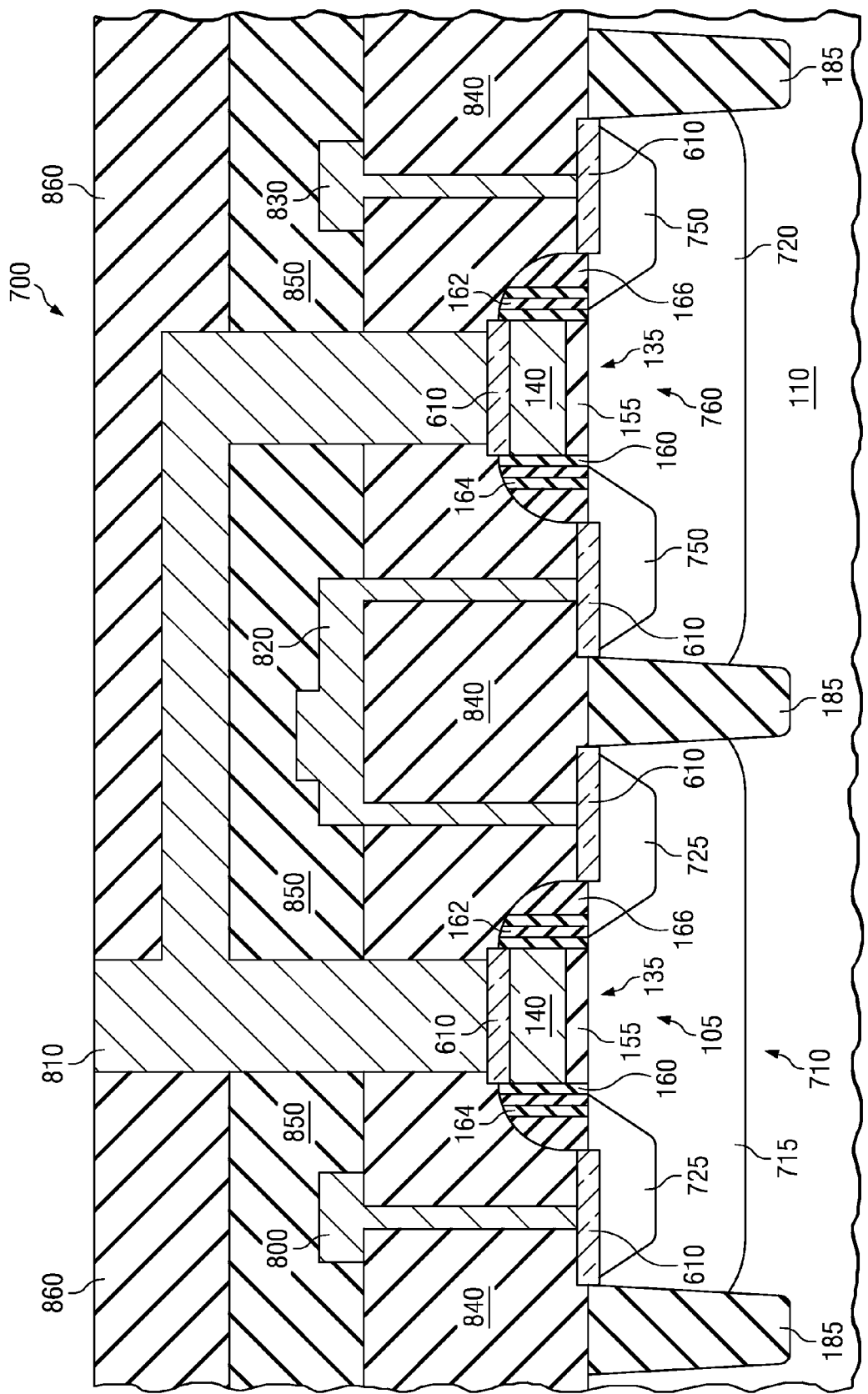

Another embodiment is a method for manufacturing a semiconductor device configured as an integrated circuit. FIGS. 7 and 8 illustrate cross-sectional views of an example method of manufacturing an integrated circuit 700 according to the principles of the present invention. The same reference numbers are used to depict analogous structures to that depicted in FIGS. 1-6.

FIG. 7 shows the integrated circuit 700 after forming a transistor device 710. In some preferred embodiments, as shown in FIG. 7, the device 710 comprises a metal oxide semiconductor (MOS) device. As further illustrated in FIG. 7, the transistor device 710 can comprise a complementary MOS (CMOS) device that includes a pMOS transistor 715 and an nMOS transistor 720. However, the device 710 can also comprise junction field effect transistors, bipolar transistors, or other conventional device components, and combinations thereof.

Any of the embodiments of the semiconductor device 100 and its method of manufacture, as discussed above in the context of FIGS. 1-6, can be used to fabricate the device 710 or the transistors 715, 720. For instance, forming one or more recessed regions 115, 117 in a semiconductor substrate 110 can comprise wet etching, such discussed above in the context of FIG. 4, to selectively remove the semiconductor substrate 110 up to a predefined orientation plane 410. The recessed region 115 (or regions 115, 117) can be formed so as to have a widest lateral opening 120 that is near a top surface 122 of the substrate 110 and to undercut a gate structure 105 formed over the substrate 110.

In some cases, e.g., when the device 710 comprises a pMOS transistor 715, the recessed region 115 (or regions 115, 117) is preferably filled with a compression producing material 725 (e.g., silicon germanium). A compressive stress 730 is produced on a channel region 135 under the gate structure 105. Preferably, the compressive stress 730 is in a direction substantially parallel to an intended current flow 740 through the channel region 135 of the pMOS transistor 715. In other cases, such as when the device 710 comprises an nMOS transistor 720, the recessed region 745 (or regions 745, 747) is preferably filled with a tension producing material 750 (e.g., silicon carbon). A tensile stress 755 is produced on the channel region 135 under the gate structure 760, preferably in a direction substantially parallel to the intended current flow 740 through the channel region 135 of the nMOS transistor 720.

FIG. 8 illustrates the integrated circuit 700 after forming interconnections 800, 810, 820, 830 that contact the device 710 and after forming insulating layers 840, 850, 860 over the device 710.

In some preferred embodiments, the semiconductor device configured as an integrated circuit 700 comprises a pMOS transistor 715 and nMOS transistor 720. The pMOS transistor 715 has a first gate structure 105 configured as the gate structure and first recessed regions 115, 117 configured as the recessed region as described above in the context of FIG. 1. The first recessed regions 115, 117 are filled with a compression producing material 725. Similarly, the nMOS transistor 720 has a second gate structure 760 configured as the gate structure and second recessed regions 745, 747 configured as the recessed region as described above in the context of FIG. 1. The second recessed regions 745, 747 are filled with a tension producing material 750. The integrated circuit 700 further includes the interconnections 800, 810, 820, 830 and insulating layers 840, 850, 860.

Those skilled in the art to which the invention relates will appreciate that other and further additions, deletions, substitutions and modifications may be made to the described example embodiments, without departing from the invention.

What is claimed is:

1. A semiconductor device, comprising:
a gate structure formed over a semiconductor substrate, the gate structure comprising a gate electrode;
isolation regions formed within said semiconductor substrate; and
a recessed region formed in said semiconductor substrate;
wherein said recessed region has a bottom surface with a first crystal orientation plane and a side surface with a second crystal orientation plane; said recessed region has a widest lateral opening that is a top surface of said semiconductor substrate; said recessed region is spaced from an adjacent isolation region at said widest lateral opening; and said widest lateral opening undercuts said gate structure without undercutting said gate electrode.

2. The device of claim 1, wherein said widest lateral opening is below and within about 25 nanometers of said top surface.

3. The method of claim 1, wherein said second crystal orientation plane is a [111] orientation plane in a silicon substrate.

4. The method of claim 1, wherein said first crystal orientation plane is a [100] or [110] orientation plane in a silicon substrate.

5. The method of claim 4, wherein said second crystal orientation plane is a [111] orientation plane in a silicon substrate.

6. The device of claim 4, configured as an integrated circuit, comprising a transistor device including said gate structure, isolation regions and recessed region; insulating layers formed over said transistor device, and interconnections that contact said transistor device.

7. The device of claim 6, wherein said transistor device comprises a pMOS transistor; and said recessed region is filled with a compression producing material.

8. The device of claim 6, wherein said transistor device comprises an nMOS transistor and said recessed region is filled with a tension producing material.

* * * * *